United States Patent [19]

Mang

[11] 4,329,938
[45] May 18, 1982

[54] EVAPORATOR TOOL WITH REMOTE SUBSTRATE REORIENTATION MECHANISM

[75] Inventor: Guenter H. Mang, Vista, Calif.

[73] Assignee: The United States of America as represented by the Secretary of the Navy, Washington, D.C.

[21] Appl. No.: 193,868

[22] Filed: Oct. 3, 1980

[51] Int. Cl.³ .............................................. C23C 13/08
[52] U.S. Cl. .................................... 118/730; 118/720; 118/715
[58] Field of Search ............... 118/715, 720, 722, 724, 118/728, 729, 730, 731; 427/255.7, 255.5, 248.1, 251

[56] References Cited

U.S. PATENT DOCUMENTS

| | | | |
|---|---|---|---|
| 2,351,537 | 6/1944 | Osterberg et al. | 118/730 |
| 2,532,971 | 12/1950 | Van Leer et al. | 118/730 X |
| 3,594,227 | 7/1971 | Oswald | 118/730 X |
| 3,746,571 | 7/1973 | Little, Jr. | 118/730 X |
| 3,783,822 | 1/1974 | Wollam | 118/730 X |
| 3,859,956 | 1/1975 | Paola | 118/720 |

Primary Examiner—John D. Smith
Assistant Examiner—Bernard F. Plantz

[57] ABSTRACT

An evaporation fixture for sequentially vapor depositing dielectric or other materials on the surface of a substrate at various slant and rotational angles without opening the fixture. A connecting rod extends from the exterior of the evaporation fixture to the interior of the fixture where it is connected to a cam mechanism. The cam mechanism is in turn mechanically coupled to a reorientation ring that is concentric with the substrate holding ring of the fixture. A slot in the reorientation ring is in engagement with the substrate holding mechanism connecting pin. Movement of the connecting rod at the end exterior to the evaporation fixture causes movement of the reorientation ring with respect to the holding ring and by means of the slot-pin coupling causes rotational and angular reorientation of the substrate with respect to the evaporated material.

13 Claims, 9 Drawing Figures

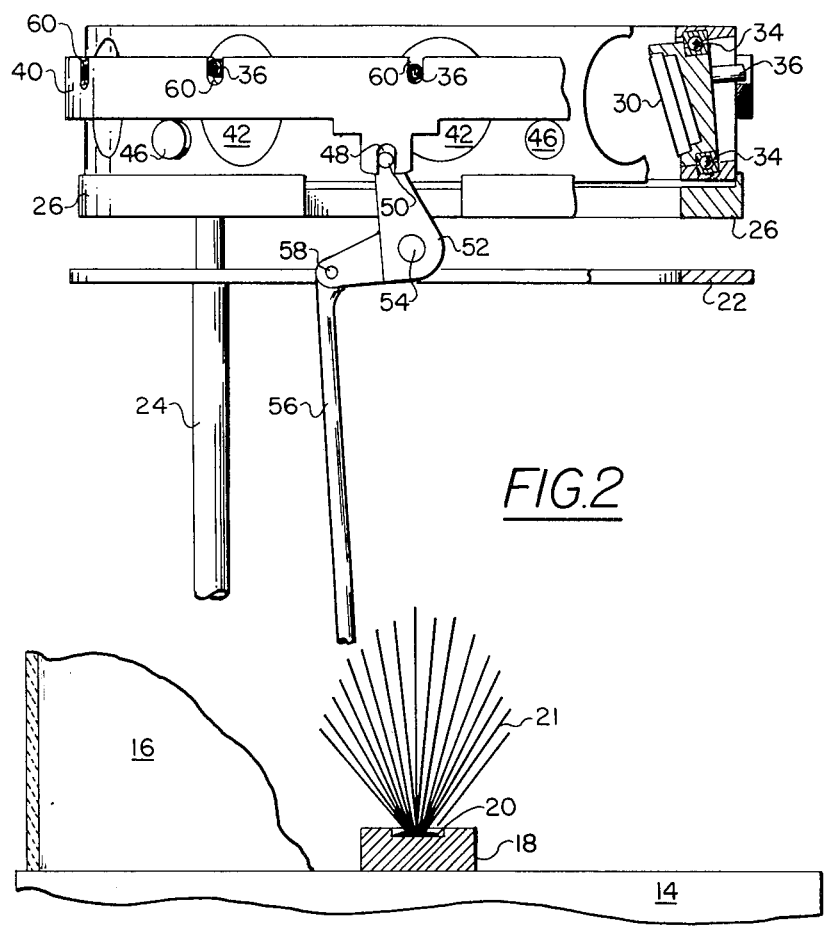
FIG.2
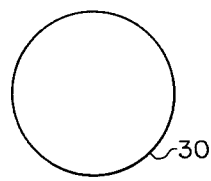
FIG.3
FIG.3A
SUBSTRATE BEFORE
EVAPORATIONS
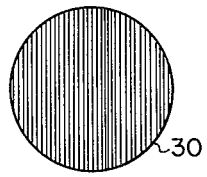
FIG.4
FIG.4A
SUBSTRATE AFTER
FIRST EVAPORATION
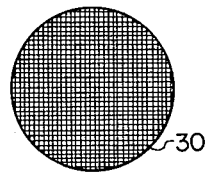
FIG.5
FIG.5A
SUBSTRATE AFTER
SECOND EVAPORATION
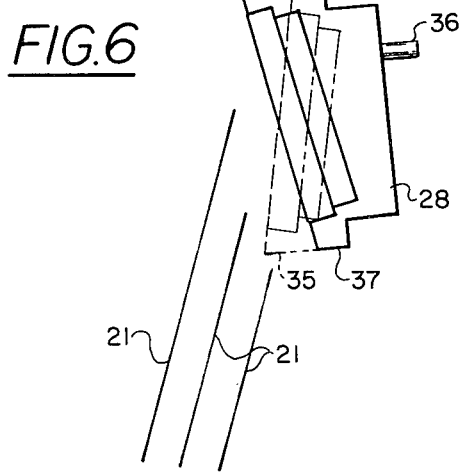
FIG.6

EVAPORATOR TOOL WITH REMOTE SUBSTRATE REORIENTATION MECHANISM

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates generally to evaporator tools, bell jar systems and processes and more particularly to methods and apparatus for vapor depositing layers of vaporized material on a substrate and still more specifically to methods and techniques for vapor depositing layers of vaporized material on a substrate at different angles and orientation in a vacuum.

One of the most reliable methods of aligning liquid crystal molecules for the formation of liquid crystal light valves and display panels is by the evaporation of dielectric materials such as $SiO_x$, $SiO_2$, etc. onto a substrate surface at various slant angles. The slant angles of the liquid crystal molecules that are deposited on the substrate, however, depend upon the evaporation angles. The conventional method to achieve variation in evaporation angles is to place the substrate which is to receive the vapor deposited layers in a vacuum bell jar of an evaporator fixture with the substrate disposed at a predetermined angle with respect to the evaporating material. The next step is to vapor deposit a film of material such as $SiO_2$ onto the substrate. The evaporator fixture is then opened and the substrate is rotated and placed at a different angle. Another layer of material is then vapor deposited on the substrate.

While the evaporator fixture is open and the substrate is reoriented it can and does get contaminated. This requirement to reopen the evaporator fixture to reorient the substrate and the subsequent substrate contamination which results is not only an unnecessarily time consuming process but also considerably lowers the product yield.

SUMMARY OF THE INVENTION

The present invention relates to an evaporation fixture which includes a mechanism for enabling sequential evaporations of dielectric and other materials at different angles and orientations to control the tilt angles of the vapor deposited molecules on the device substrate without excess handling of the substrate caused by exposing the substrate to the atmosphere and adjusting the evaporation angle and orientation before a second or subsequent evaporation. In accordance with the present invention a mechanism is disclosed for controlling the tilt angles and rotational orientation of the substrate to receive the vapor deposited material without opening the vacuum bell jar of the evaporator for angle and orientation adjustment. This invention has the advantage of higher yield than conventional schemes. Because of the elimination of excess handling during the sequential evaporations, the production time required for the vapor deposition process is reduced by half as compared with the conventional method.

OBJECTS OF THE INVENTION

Accordingly, it is the primary object of the present invention to disclose a mechanism for reorienting or repositioning a substrate or the like that is located within a vacuum bell jar from the exterior of the vacuum bell jar and without opening the vacuum bell jar.

Another object of the present invention is to disclose a mechanism for precisely and repeatedly controlling the orientation and reorientation of a substrate that is intended to receive a layer of material on the surface thereof by means of vapor deposition.

Other objects, advantages and novel features of the invention will become apparent from the following detailed description of the invention when considered in conjunction with the accompanying drawings.

BRIEF DESCRIPTION OF THE FIGURES

FIG. 2 is a partially cut away view of the reorientation mechanism of the present invention.

FIGS. 3 and 3A are top and side views, respectively, of a substrate before evaporation deposition.

FIGS. 4 and 4A are top and side views, respectively, of a substrate after a first evaporation process.

FIGS. 5 and 5A are top and side views, respectively, of the substrate of FIGS. 4 and 4A after a second evaporation process.

FIG. 6 is a partial side view of the canted substrate clamp of the present invention illustrating in dotted line the change in slant angle brought about by rotation of the substrate clamp.

DESCRIPTION OF THE PREFERRED EMBODIMENT

Figure 1:
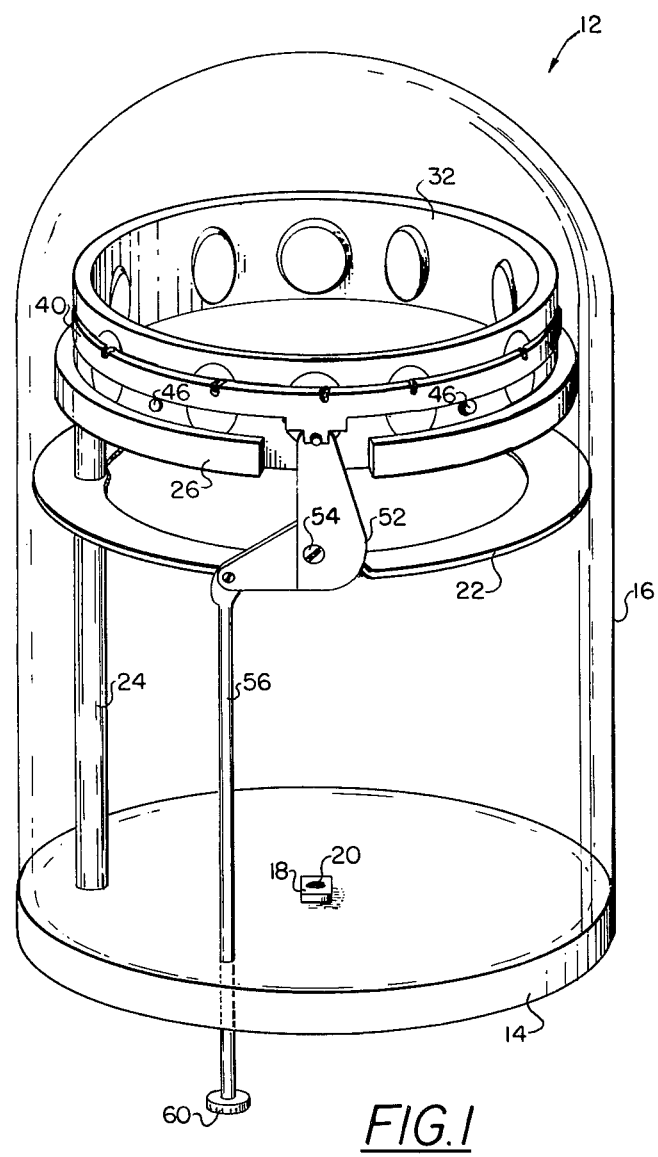
FIG. 1 is a perspective view of the reorientation mechanism of the present invention.

Referring now to FIGS. 1 and 2 there are illustrated in isometric and partially cut away views, respectively, the evaporator and vacuum bell jar including the present invention which is described as follows. The bell jar and evaporator 12 includes a base plate 14 and a cover 16 which join together to form a vacuum chamber therewithin. A heater 18 is situated on the base plate 14 and contains the material 20 to be evaporated. The evaporated material is represented in FIG. 2 by the radiating lines designated by reference character 21. A support ring 22 is disposed within the bell jar 12 and is supported by support ring stand 24, only one leg of which is shown, it being understood that three legs are preferable. A holding ring 26 is secured to the support ring 22 and support ring stand 24 by suitable means (not shown). A canted, generally annular substrate holder 28 serves to clamp the substrate 30 in position within the bell jar 12. The canted substrate holder 28 is secured to the bearing housing ring 32 by means of the annular bearing assembly 34. Substrate holder 28 has connected thereto a substrate holder pin 36 which engages with a slot 60 in the synchronizing ring 40. It is noted that the bearing housing ring 32 is provided with a plurality of apertures 42 for receiving the substrate holders 28 so that a number of substrate holders 28 and bearing assemblies 44 can be utilized at one time to simultaneously vapor deposit a multiplicity of substrates. For purposes of simplicity, however, only one such substrate holder 28 and bearing assembly 34 has been illustrated, it being understood that a separate substrate holder 28 and bearing assembly 34 could be used in each aperture 42.

The synchronizing ring 40 is concentric with the bearing housing ring 32 and is supported by bearings 46 which are affixed to the bearing housing ring 32. Synchronizing ring 40 has a slot member 48 formed therein for engagement with the connecting pin 50 of the cam mechanism 52. Cam mechanism 52 is secured at pivot point 54 to the support ring 22 by suitable means (not shown). A connecting rod 56 is connected to the cam member 52 by means of pin 58 and extends through the base plate 14 of the bell jar 12 to the exterior of the bell jar where it terminates in control knob 60. A suitable vacuum seal (not shown) is provided in the base plate 14 around the connecting rod 56 to insure the integrity of the vacuum within the bell jar 12.

Referring to FIGS. 2 and 6 it is seen that the substrate clamp 28 is canted such that it extends out from bearing assembly 34 further at portion 35 than it does at portion 37, with a linear taper between portions 35 and 37. This canted feature of the substrate clamp 28 serves to enable a change in the slant angle of the clamp 28 and substrate 30 simultaneously with a change in the rotational orientation of substrate 30 as described below. As seen in dotted lines in FIG. 6, the substrate clamp 28 and substrate 30 have been rotated by 90°, thereby also changing the slant angle of the substrate 30 with respect to the vaporized material 21.

The operation of the reorientation mechanism of the present invention will now be described with reference to FIGS. 1 and 2. As seen in FIGS. 1 and 2, connecting rod 56 is free to move up and down in response to raising or lowering of the external knob 60. This action causes the cam member 52 to pivot around pivot point 54 and to result in a translation of motion of pin member 50 such that pin member 50 moves to the left in response to lowering the external knob 60 and such that pin member 50 moves to the right in response to raising the external knob 60. This left-right motion of pin member 50 also results in left-right motion of the synchronizing ring 40 due to engagement of pin 50 with the slot member 48 of synchronizing ring 40. Synchronizing ring 40 is also provided with slot members 60 for engagement with the pin members 36 connected to the respective substrate holders 28. Movement to the right and to the left of synchronizing ring 40 therefore results in a clockwise and counterclockwise rotation, respectively, of the substrate holders 28 via the engagement of the connecting pin 36 and slot member 60. As much as 90° of rotation of the substrates 30 may thus be enabled by an up or down motion of the external knob 60. As illustrated in dotted lines in FIG. 6 and described above, the rotation of substrate 30 by movement of remote control knob 60 also serves to change the slant angle of the substrate 30 due to the resulting rotation of the canted surface of the substrate clamp 28.

A typical operating sequence for vapor deposition of a dielectric or other material 20 onto the substrate 30 is as follows. A substrate such as the substrate illustrated in FIGS. 3 and 3A are mounted in the substrate holders 28. The material 20 to be evaporated is placed in the heater 18. The bell jar housing 16 is lowered and the air is pumped out to create the desired vacuum. The heater 18 is then turned on to evaporate the amount of material 20 to be deposited as a first vapor deposition layer on the substrate 30. The connecting rod 56 is then raised through activation of the external knob 60. This rotates the cam member 52 which rotates the synchronizing ring 40 which in turn rotates the substrate holders 28 with the substrates 30 by 90° or other desired angle of rotation and positions the substrate 30 at a smaller angle to the source 20 at the same time. The substrate 30 may appear as illustrated in FIGS. 4 and 4A after this first vapor deposition process, the longitudinal lines indicating a vapor deposition slant angle. The heater is then turned on to evaporate the material 20 for the second layer to be deposited on the substrate 30. After this second vapor deposition process, the substrate may appear as the substrate illustrated in FIGS. 5 and 5A having two vapor deposition layers with slant angles of 90° with respect to each other.

Obviously many modifications and variations of the present invention are possible in the light of the above teachings. It is therefore to be understood that within the scope of the appended claims the invention may be practiced otherwise than as specifically described.

What is claimed is:

1. An evaporator mechanism comprising:
   a housing forming a vacuum chamber;
   first means situated within said housing for securing at least one substrate within said vacuum chamber, said first means comprising a support member, a holding ring connected to said support member, and a substrate clamp secured to said holding ring for securing said at least one substrate;
   second means connected to said first means and extending to the exterior of said housing for enabling rotation of said substrate from the exterior of said housing, said second means comprising a movable ring adjacent to said holding ring, a cam mechanism connected to said movable ring, and a connecting rod connected to said cam mechanism and extending to the exterior of said housing.

2. The mechanism of claim 1 wherein said second means further comprises:
   a pin member connected to said cam mechanism; and
   said moveable ring has at least one slot therein for receiving said pin member.

3. The mechanism of claim 2 wherein:
   said substrate clamp includes a substrate clamp pin connected thereto; and
   said moveable ring includes at least one slot therein for engagement with said substrate clamp pin.

4. The mechanism of claim 3 wherein:
   said moveable ring is concentric with said holding ring.

5. The mechanism of claim 4 further comprising:
   at least one bearing connected to said holding ring for slideably engaging said moveable ring.

6. The mechanism of claim 5 further comprising:
   a substrate clamp bearing assembly in slideable engagement with said substrate clamp for enabling rotation of said substrate clamp with respect to said holding ring.

7. The mechanism of claim 6 wherein:
   said substrate clamp has a canted surface for enabling variation in the slant angle of said surface by rotation of said substrate clamp.

8. The mechanism of claim 1 wherein:
   said substrate clamp has a canted surface for enabling variation in the slant angle of said surface by rotation of said substrate clamp.

9. In a bell jar system for depositing matter onto the surface of a substrate by evaporation of said matter including a bell jar housing, means for evaporating said matter within said bell jar housing and means for securing said substrate at a predetermined orientation with said bell jar housing the improvement comprising:
   means for reorienting said substrate within said housing from said predetermined orientation from a remote location exterior to said bell jar housing, said reorienting means comprising a connecting rod extending from the exterior of said bell jar to the interior of said bell jar, a cam mechanism connected to said connecting rod, and a movable ring operably coupled to said cam mechanism.

10. The system of claim 9 wherein:

said means for securing said substrate comprises a support ring and a substrate holder moveably secured to said support ring; and said moveable ring is concentric with said support ring.

11. The system of claim 10 wherein: said substrate holder includes a bearing assembly for enabling said substrate holder to rotate with respect to said support ring.

12. The system of claim 11 including:

a substrate holder connecting pin connected to said substrate holder; and a slot in said moveable ring for engagement with said substrate holder connecting pin.

13. The system of claim 12 wherein:

said substrate holder has a canted surface for enabling variation in the slant angle of said substrate in response activation of said reorienting means.

* * * * *